(12) United States Patent
Yeh et al.

(10) Patent No.: US 10,102,098 B2
(45) Date of Patent: Oct. 16, 2018

(54) METHOD AND SYSTEM FOR RECOMMENDING APPLICATION PARAMETER SETTING AND SYSTEM SPECIFICATION SETTING IN DISTRIBUTED COMPUTATION

(71) Applicant: INDUSTRIAL TECHNOLOGY RESEARCH INSTITUTE, Hsinchu (TW)

(72) Inventors: Chao-Chun Yeh, Kaohsiung (TW); Sheng-An Chang, Pingtung (TW); Xuan-Yi Lin, Taichung (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/981,825

(22) Filed: Dec. 28, 2015

(65) Prior Publication Data

US 2017/0185503 A1    Jun. 29, 2017

(30) Foreign Application Priority Data

Dec. 24, 2015 (JP) ................................. 2015-252574

(51) Int. Cl.
*G06F 11/34* (2006.01)
*G06F 11/30* (2006.01)
(Continued)

(52) U.S. Cl.
CPC ............ *G06F 11/3409* (2013.01); *G06F 9/50* (2013.01); *G06F 11/302* (2013.01); *G06F 17/50* (2013.01); *G06F 11/3404* (2013.01)

(58) Field of Classification Search
CPC .............................. G06F 9/54; G06F 11/3664
(Continued)

(56) References Cited

U.S. PATENT DOCUMENTS 5,257,368 A    10/1993  Benson et al.
6,038,677 A     3/2000  Lawlor et al.
(Continued)

FOREIGN PATENT DOCUMENTS

CN    102929667 A    2/2013
CN    103064664 A    4/2013
(Continued)

OTHER PUBLICATIONS

Zhou Mingqiang, A Graph-based Clustering Algorithm for Anomaly Intrusion Detection (Year: 2012).*

(Continued)

*Primary Examiner* — Lechi Truong
(74) *Attorney, Agent, or Firm* — Rabin & Berdo, P.C.

(57) ABSTRACT

A method and a system for recommending an application parameter setting and a system specification setting in a distributed computation are provided. The method includes the following steps. An application information, a framework information and a system information are received. Whether a performance model which includes a relationship of a performance, the application information, the framework information and the system information is stored in a storage unit is determined. The application parameter setting and the system specification setting are obtained according to the performance model, if the performance model is stored in the storage unit.

14 Claims, 5 Drawing Sheets

(51) Int. Cl.
  *G06F 17/50* (2006.01)
  *G06F 9/50* (2006.01)
(58) Field of Classification Search
  USPC .......................................... 719/310; 717/124
  See application file for complete search history.

(56) References Cited

U.S. PATENT DOCUMENTS

| | | | |
|---|---|---|---|
| 6,059,842 | A | 5/2000 | Dumarot et al. |
| RE38,865 | E | 11/2005 | Dumarot et al. |
| 7,243,337 | B1 | 7/2007 | Cowan |
| 7,549,077 | B2 | 6/2009 | White et al. |
| 7,627,671 | B1* | 12/2009 | Palma ................ G06F 11/3616 709/223 |
| 7,827,442 | B2 | 11/2010 | Sharma et al. |
| 8,190,445 | B2 | 5/2012 | Kuth et al. |
| 8,620,774 | B1 | 12/2013 | Li et al. |
| 8,621,052 | B2 | 12/2013 | Keohane et al. |
| 8,676,939 | B2 | 3/2014 | Donahue et al. |
| 8,775,577 | B1 | 7/2014 | Alford et al. |
| 8,924,328 | B1 | 12/2014 | Kozlovsky et al. |
| 8,930,905 | B2 | 1/2015 | Lee et al. |
| 9,053,070 | B1 | 6/2015 | Arguelles |
| 2003/0014507 | A1* | 1/2003 | Bertram ............... G06F 11/3409 709/223 |
| 2007/0074203 | A1 | 3/2007 | Curtis et al. |
| 2007/0255430 | A1 | 11/2007 | Sharma et al. |
| 2008/0092122 | A1* | 4/2008 | Caprihan ............ G06F 11/3409 717/127 |
| 2009/0077011 | A1 | 3/2009 | Natarajan et al. |
| 2012/0047240 | A1 | 2/2012 | Keohane et al. |
| 2012/0079098 | A1* | 3/2012 | Moehler ............. G06F 11/0775 709/224 |
| 2013/0204948 | A1 | 8/2013 | Zeyliger et al. |
| 2013/0211556 | A1 | 8/2013 | Slessman et al. |
| 2013/0254196 | A1 | 9/2013 | Babu et al. |
| 2014/0031956 | A1 | 1/2014 | Slessman et al. |
| 2014/0040438 | A1 | 2/2014 | Donahue et al. |
| 2014/0040656 | A1 | 2/2014 | Ho et al. |
| 2014/0047084 | A1 | 2/2014 | Breternitz et al. |
| 2014/0047095 | A1 | 2/2014 | Breternitz et al. |
| 2014/0047272 | A1 | 2/2014 | Breternitz et al. |
| 2014/0047341 | A1 | 2/2014 | Breternitz et al. |
| 2014/0047342 | A1 | 2/2014 | Breternitz et al. |
| 2014/0074647 | A1 | 3/2014 | Mukherjee et al. |
| 2014/0122546 | A1 | 5/2014 | Liao et al. |
| 2014/0149537 | A1 | 5/2014 | Shankaran et al. |
| 2014/0229607 | A1 | 8/2014 | Jung et al. |
| 2014/0258446 | A1 | 9/2014 | Bursell |
| 2014/0278807 | A1 | 9/2014 | Bohacek |
| 2014/0280805 | A1 | 9/2014 | Sawalha |
| 2014/0280946 | A1 | 9/2014 | Mukherjee et al. |
| 2014/0310039 | A1 | 10/2014 | Casey et al. |
| 2014/0317253 | A1 | 10/2014 | Alford et al. |
| 2015/0039735 | A1 | 2/2015 | Zeyliger et al. |
| 2015/0058843 | A1* | 2/2015 | Holler .................... G06F 9/455 718/1 |
| 2015/0089031 | A1 | 3/2015 | Kalali |
| 2015/0310335 | A1* | 10/2015 | Fan ..................... G06N 99/005 706/12 |

FOREIGN PATENT DOCUMENTS

| | | |
|---|---|---|
| CN | 103593323 A | 2/2014 |
| CN | 103701635 A | 4/2014 |
| CN | 103942108 A | 7/2014 |
| CN | 104331520 A | 2/2015 |
| CN | 104717091 A | 6/2015 |
| JP | 2015-532997 A | 11/2015 |
| TW | 439028 B | 6/2001 |
| TW | I467491 B | 1/2015 |
| TW | I499971 B | 9/2015 |
| WO | WO-2015066979 A1 | 5/2015 |

OTHER PUBLICATIONS

Kohei Ito et al., "Classification of instances using cost information in cloud", forum on information Technology 2012, Sep. 4-6, 2012.
Japanese Office Action dated Nov. 22, 2016 with translation.
Taiwanese Office Action dated May 15, 2017.
Eric Sammer; "Hadoop operations"; O'Reilly Media Inc.; 2012; p. 212.
Jeff Bean, Jonathan Hsieh; "Improving HBase Availability and Repair"; Cloudera Inc.. 2012. p. 7.
Nezih Yigitbasi et al., "Toward Machine Learning-Based Auto-tuning of Map Reduce", IEEE 21st International Symposium on Modelling, Analysis & Simulation of Computer and Telecommunication Systems, IEEE Computer Society, 2013, pp. 11-20.
https://hadoop.apache.org/docs/stable/hadoop-mapreduce-client/hadoop-mapreduce-client-core/mapred-default.xml., Aug. 4, 2018.
Tom White, "Hadoop: The Definitive Guide", Second Edition, O'Reilly Media, Inc.. 2010. p. 167-p. 180.
Dominique Heger, "Hadoop Performace Tuning—A Pragmatic & Iterative Approach", DHTechnologies ? www.dhtusa.com), 2013, pp. 1-16.
Shrinivas Joshi, "Hadoop Tuning Guide. Advanced Micro Devices", Technical Report. 2012.
Herodotos Herodotou, et al., "Profiling, What-if Analysis, and Costbased Optimization of MapReduce Programs", The 37th International Conference on Very Large Data Bases, Aug. 29, Sep. 3, 2011, Seattle, Washington, Proceedings of the VLDB Endowment, vol. 4, No. 11, Copyright 2011 VLDB Endowment 21508097/11/08.
Donald R. Jones, et al., "Efficient Global Optimization of Expensive Black-Box Functions", Journal of Global Optimization 13: 455-492, 1998.
Herodotos Herodotou, "Hadoop Performance Models", Technical Report, CS-2011-05, Computer Science Department, Duke University, arXiv:1106.0940v1 [cs.DC] Jun. 6, 2011.
Tom White, "Hadoop: The Definitive Guide", Second Edition. O'Reilly Media, Inc.. 2010. p. 180-p. 182.
Leo Breiman, "Random Forests", Statistics Department, University of California, Jan. 2001, pp. 1-32.
Pierre Geurts, et al. "Extremely randomized trees", Mach j Learn () : DOI 10.1007/s10994-006-6226-1, Published online: Mar. 2, 2006, Springer Science + Business Media, Inc. 2006.
Torsten Hothorn, et al., "Model-based Boosting 2.0", Journal of Machine Learning Research 11 (2010) 2109-2113.
T. Ye and S. Kalyanaraman, "A recursive random search algorithm for large-scale network parameter configuration," ACM SIGMETRICS Performance Evaluation Review, vol. 31, pp. 196-205, 2003.
B. Selman and C. P. Gomes, "Hill-climbing Search," Encyclopedia of Cognitive Science, 2006.
Jimmy Lin, et al., "Data-intensive Text Processing with MapReduce", Morgan & Claypool Synthesis Lectures on Human Language Technologies, University of Maryland, College Park, Apr. 11, 2010, pp. 1-171.
Shengsheng Huang, et al., "The HiBench Benchmark Suite: Characterization of the MapReduce-Based Data Analysis", ICDE Workshops 2010, Conference Paper, IEEE Xplore, Apr. 2010, pp. 41-51.
Chuliang Weng, et al., "Automatic Performance Tuning for the Virtualized Cluster System", 29th IEEE International Conference on Distributed Computing Systems, IEEE Computer Society, 2009, pp. 183-190.
Sadeka Islam, et al., "Empirical prediction models for adaptive resource provisioning in the cloud", Future Generation Computer Systems 28 (2012), pp. 155-162, available online: SciVerse ScienceDirect, journal homepage: www.elsevier.com/locate/fgcs.
Herodotos Herodotou, et al., "Starfish: A Self-tuning System for Big Data Analytics", 5th Biennial Conference on Innovative Data Systems Research (CIDR '11), Asilomar, California, USA, Jan. 9-12, 2011, pp. 261-272.
Shivnath Babu, Towards Automatic Optimization of MapReduce Programs, SoCC'10, Indianapolis, Indiana, USA, Jun. 10-11, 2010.
Herodotos Herodotou, et al., "MapReduce Programming and Costbased Optimization? Crossing this Chasm with Starfish", The 37th Inter-

(56) References Cited

OTHER PUBLICATIONS national Conference on Very Large Data Bases, Aug. 29-Sep. 3, 2011, Seattle, Washington, Proceedings of the VLDB Endowment, vol. 4, No. 12.

Chi-Ou Chen, et al., "Machine Learning-Based Configuration Parameter Tuning on Hadoop System", 2015 IEEE International Congress on Big Data, IEEE Computer Society, pp. 386-392.

Herman Anthony Carneiro, et al., "Google Trends: A Web-Based Tool for Real-Time Surveillance of Disease Outbreaks", Clinical Infectious Diseases, Infectious Diseases Society of America, 2009; 49: pp. 1557-1564.

James Bennett, et al., "The Netflix Prize", KDDCup'07, Aug. 12, 2007, San Jose, California, USA, pp. 3-6.

J. K. Laurila, D. Gatica-Perez, I. Aad, O. Bornet, T.-M.-T. Do, O. Dousse, et al., "The mobile data challenge: Big data for mobile computing research," in Pervasive Computing, 2012.

Mark Andrejevic, "Surveillance in the Big Data Era", Emerging Pervasive Information and Communication Technologies (PICT) vol. 11 of the series Law, Governance and Technology Series, May 9, 2013, pp. 55-69.

Martin Hall, "Hadoop: From Open Source Project to Big Data Ecosystem", website: (https://gigaom.com/2010/10/02/hadoop-from-open-source-project-to-big-data-ecosystem-2/).

"What is OpenStack?", Software >> OpenStack Open Source Cloud Computing Software, website: (https://www.openstack.org/software/liberty/), Aug. 3, 2018.

"Xen Project Software Overview—Xen", website: (http://wiki.xenproject.org/wiki/Xen_Overview), Aug. 3, 2018.

"Server Virtualization with VMware vSphere", website: (http://www.vmware.com/products/vsphere/), Aug. 3, 2018.

"MapReduce Tutorial", website: (http://hadoop.apache.org/docs/r1.2.1/mapred_tutorial.html).

Apache Hive. Available: https://hive.apache.org/, Aug. 3, 2018.

"Apache Spark™—Lightning-Fast Cluster Computing", website: (http://spark.apache.org), Aug. 3, 2018.

"Google Prediction API—Predictive Analysis for Business forecasting—Google Cloud Platform", website: (https://cloud.google.com/prediction/).

"Amazon Machine Learning—Predictive Analytics with AWS", website. (http://aws.amazon.com/machine-learning/?nc1=h_ls), Aug. 3, 2018.

"Features | BigML.com", website: (https://bigml.com/features), Aug. 3, 2018.

A. Rabkin and R. H. Katz, "How hadoop clusters break," Software, IEEE, vol. 30, pp. 88-94, 2013.

Henry H. Liu, "Software performance and scalability: a quantitative approach", John Wiley & Sons. 2009, p. 71.

Xuhui Liu, et al., "Implementing WebGIS on Hadoop: A Case Study of Improving Small File I/O Performance on HDFS", Conference Paper • Jan. 2009, IEEE, (website: http://www.researchgate.net/publication/221202162).

Shrinivas B. Joshi, "Apache Hadoop Performance-Tuning Methodologies and Best Practices", ICPE'12, Apr. 22-25, 2012, Boston, Massachusetts, USA, pp. 241-242.

"Tuning the Cluster for MapReduce v2 (YARN)", (website: http://www.cloudera.com/content/www/en-us/documentation/enterprise/5-4-x/topics/cdh_ig_yarn_tuning.html), Aug. 3, 2018.

N. B. Rizvandi, A. Y. Zomaya, A. J. Boloori, and J. Taheri, "On modeling dependency between mapreduce configuration parameters and total execution time," arXiv preprint arXiv:1203.0651, 2012.

* cited by examiner

US 10,102,098 B2

METHOD AND SYSTEM FOR RECOMMENDING APPLICATION PARAMETER SETTING AND SYSTEM SPECIFICATION SETTING IN DISTRIBUTED COMPUTATION

TECHNICAL FIELD

The disclosure relates in general to a method and a system for recommending an application parameter setting and a system specification setting, and more particularly to a method and a system for recommending an application parameter setting and a system specification setting in a distributed computation.

BACKGROUND

In a distributed computation, the performance of the distributed computation is related to an application parameter setting and a system specification setting. Familiarity with the software and hardware is required for manually adjusting the application parameter setting and the system specification setting. However, because most people do not familiar with the software and hardware, the application parameter setting and the system specification setting cannot be accurately adjusted. If one application is needed to be performed in an existed cluster, the application parameter setting may not be accurately adjusted and the performance of performing the application will be reduced. Or, if one cluster is needed to be newly established, the system specification setting may not be accurately adjusted and the performance of performing any application will be reduced.

SUMMARY

The disclosure is directed to a method and a system for recommending an application parameter setting and a system specification setting in a distributed computation.

According to one embodiment, a method for recommending an application parameter setting and a system specification setting in a distributed computation is provided. The method includes the following steps. An application information, a framework information and a system information are received. Whether a performance model which includes a relationship of a performance, the application information, the framework information and the system information is stored in a storage unit is determined. The application parameter setting and the system specification setting is obtained according to the performance model, if the performance model is stored in the storage unit.

According to another embodiment, a system for recommending an application parameter setting and a system specification setting in a distributed computation is provided. The system includes a communication unit, a storage unit and a processing unit. The communication unit receives an application information, a framework information and a system information. The processing unit determines whether a performance model which includes a relationship of a performance, the application information, the framework information and the system information is stored in the storage unit. The processing unit obtains the application parameter setting and the system specification setting according to the performance model, if the performance model is stored in the storage unit.

Figure 1:
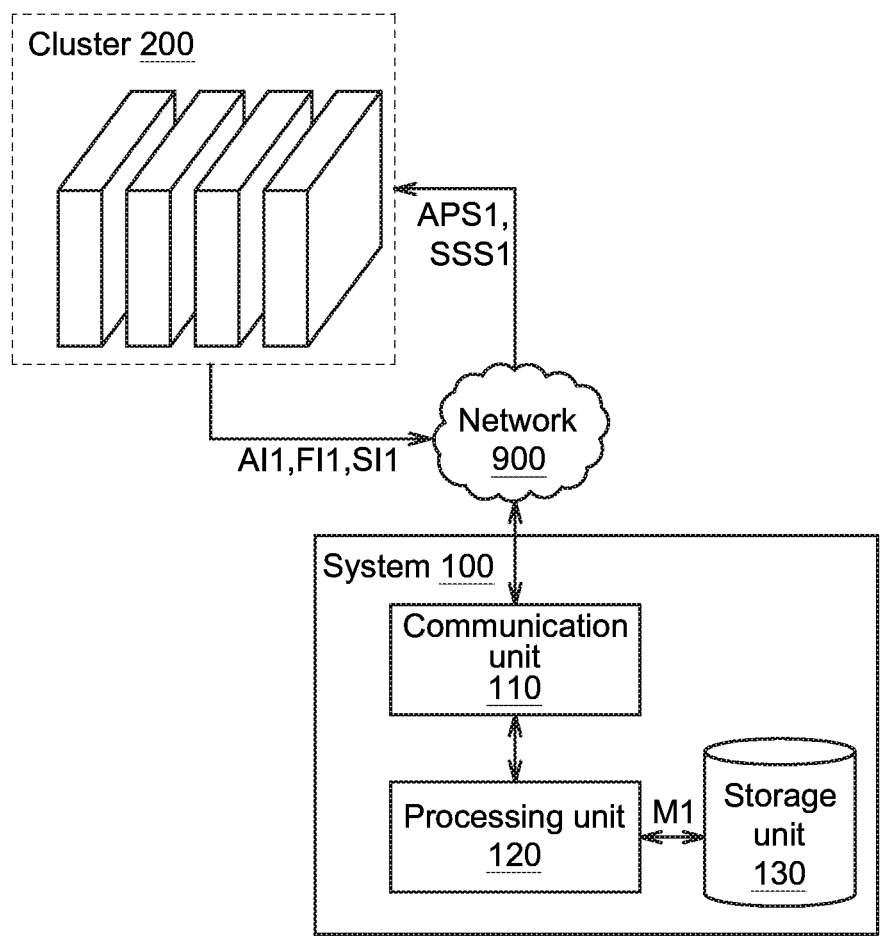
FIG. 1 shows a system for recommending the application parameter setting and the system specification setting in the distributed computation according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
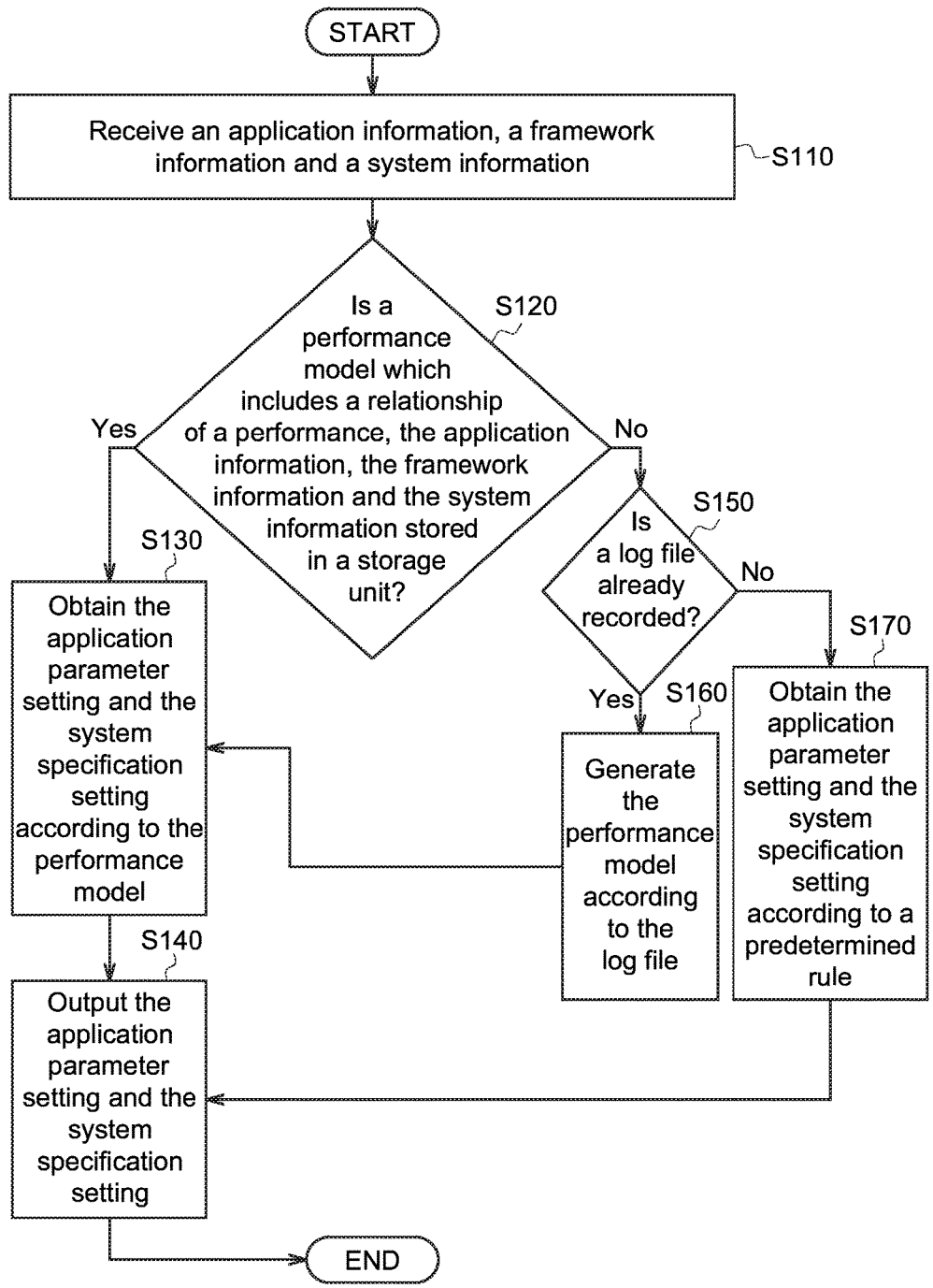
FIG. 2 shows a flowchart of a method for recommending the application parameter setting and the system specification setting in the distributed computation.

In a distributed computation, the performance of the distributed computation is related to an application parameter setting and a system specification setting. Please refer to FIGS. 1 and 2. FIG. 1 shows a system 100 for recommending the application parameter setting and the system specification setting in the distributed computation according to one embodiment, and FIG. 2 shows a flowchart of a method for recommending the application parameter setting and the system specification setting in the distributed computation. In one embodiment, a framework of the distributed computation can be exemplified by Hadoop MapReduce. The Hadoop MapReduce is a master-slave architecture. There are two implementations of Hadoop MapReduce framework, namely "classic" and "yarn." The classic implementation is also called Hadoop MapReduce 1 and the yarn implementation is also called Hadoop MapReduce 2.

In the Hadoop MapReduce 1, a master node runs a process called JobTracker to manage a cluster of slave nodes and each of a plurality of slave node also runs a process called TaskTracker. The JobTracker dispatches a plurality of map tasks and a plurality of reduce tasks to those slave nodes.

In the Hadoop MapReduce 2, a resource manager node runs a process called ResourceManager to coordinate the allocation of compute resources of a plurality of computer nodes in a Hadoop cluster. Each of the compute nodes in a Hadoop cluster runs a process called NodeManager to launch and monitor compute containers. A corresponding MRAppMaster process for each MapReduce job is launched by a NodeManager to coordinate map tasks and reduce tasks. The MRAppMaster and map tasks and reduce tasks run in containers that are scheduled by the ResourceManager and managed by the NodeManagers.

In a Hadoop MapReduce job, if the number of the map tasks and the reduce tasks is more than the number of a plurality of map slots and a plurality of reduce slots, the map tasks and the reduce tasks will be run in multiple waves. The map slot includes a set of the map tasks which are performed at the same time. The reduce slots includes a set of the reduce tasks which are performed at the same time. If there are 100 map tasks and the map slot include 5 map tasks, then the 100 map tasks will be run in 20 (=100/5) waves. For example, "MapTaskMax" is a map slot, and "ReduceTasksMax" is a reduce slot.

In Hadoop MapReduce, each of the map tasks can be divided into four phases, i.e. a Read phase, a Map phase, a Spill phase, and a Merge phase. In the Read phase, an input split is read from Hadoop Distributed File System (HDFS) and the input split is transformed into a set of key-value pairs. The input is divided into several input split whose size is recorded as "SplitSize." In the Map phase, a map program is executed with the input split and an intermediate data is outputted to a memory buffer. In the Spill phase, when the memory buffer is almost full, a background thread starts to combine and compress the contents in the memory buffer into spill files. In the Merge phase, a plurality of spill files are merged into a single map output file which will be fetched by the reduce tasks.

On the other side, the reduce task can be divided into four phases, i.e. a Shuffle phase, a Merge phase, a Reduce phase, and a Write phase. In the Shuffle phase, the intermediate data is fetched from the map tasks into the memory buffer. In the Merge phase, the intermediate data produced by different map tasks are merged to create a single input file for the reduce function. In the Reduce phase, a reduce program is executed with the input file to generate the final output data. In the Write phase, a final output data is compressed and wrote into the HDFS.

Please refer to FIG. 1. The system 100 includes a communication unit 110, a processing unit 120 and a storage unit 130. The system 100 may be a computer or a cluster including a plurality of computers. The communication unit 110 is used for receiving and transmitting data. For example, the communication unit 110 may be a wireless communication (e.g., 3G, 4G, LTE (Long Term Evolution), LTE Advanced, etc.) module, a network (e.g., wireless LAN (local area network), Ethernet) module, a transmitting line, a USB port, or a memory card reader. The processing unit 120 is used for performing a plurality of calculating procedures, a plurality of determining procedures, or a plurality of analyzing procedures. The processing unit 120 may be a processor (e.g., CPU), a chip, a circuit, a circuit board, or a storage device storing a plurality of program codes. The storage unit 130 is used for storing data. For example, the storage unit 130 may be a hard disk, an optical disk, a memory, or a storage cloud.

The system 100 is connected to a cluster 200 including a plurality of computers via a network 900. Please refer to FIG. 2, the method for recommending the application parameter setting and the system specification setting in the distributed computation will be illustrated with the system 100.

In step S110, an application information AI1, a framework information FI1 and a system information SI1 are received by the communication unit 110 from the cluster 200 via the network 900. In one embodiment, the application information AI1 may include an application name, a hash code, a checksum, a profile, an application metadata, a program identification, and/or a resource performance. The framework information FI1 may include a parallelism, a resource configuration, a resource management strategy, a data management strategy, a computation model tunable parameter, and/or a supported environment control parameter. For example, please refer to table I, which shows some items in the framework information FI1.

TABLE I

| Abbreviation | Brief Description | Category |
| --- | --- | --- |
| MapHeapMax | Maximum Java heap size to execute a map task | Map |
| MapTasksMax | The maximum number of the map tasks that will be run simultaneously by a tasktracker | Map & Reduce |
| SplitSize | The minimum size of a chunk. | Map |
| SortFactor | Number of sorted streams to be merged during the multiphase external sorting | Map & Reduce |
| SortMB | Size(MB) of a map-side buffer for storing and sorting key-value pairs produced by the map function | Map |
| SortPer | Usage threshold of the map-side memory buffer to trigger a sort and spill of the stored key-value pairs | Map |
| RecordPer | Fraction of SortMB for storing metadata for every key-value pair stored in the map-side buffer | Map |
| MapOutputCompress | Boolean flag to turn on the compression of map output data | Map & Reduce |
| HttpThread | The number of worker threads for the http server | Map & Reduce |
| ReduceHeapMax | Maximum Java heap size to execute a reduce task | Reduce |
| ReduceTasksMax | The maximum number of reduce tasks that will be run simultaneously by a task tracker | Map & Reduce |
| ReduceTasksNum | Number of reduce tasks | Reduce |
| ReduceCopyNum | The number of parallel transfers run by reduce during the copy (shuffle) phase | Reduce |
| ShuffleMergePer | Usage threshold of reduce-side memory buffer to trigger reduce-side merging during the shuffle | Reduce |
| ReduceSlowstart | Proportion of map tasks that is needed to be completed before any reduce tasks are scheduled | Reduce |
| inMenMergeThreshold | Threshold on the number of copied map outputs to trigger reduce-side merging during the shuffle | Reduce |
| ShuffleInputPer | Percentage of the reduce task's heap memory used to buffer the output data copied from the map tasks during the shuffle | Reduce |
| ReduceInputPer | Percentage of the reduce task's heap memory used to buffer the map output data while the reduce function is applied | Reduce |
| OutputCompress | Boolean flag to turn on the compression of the job's output | Reduce |
| JVMReuse | The number of tasks to run per jvm | Map & Reduce |
| MinAllocVcores | The smallest number of virtual CPU cores that can be requested for a container | Resource |
| MaxAllocVcores | The largest number of virtual CPU cores that can be requested for a container | Resource |
| MinAllocMB | The smallest amount of physical memory, in MB, that can be requested for a container | Resource |
| MaxAllocMB | The largest amount of physical memory, in MB, that can be requested for a container | Resource |

In Hadoop MapReduce, there are hundreds of items relate to the framework. Some items are selected as shown in table I. These items mainly control four performance-related factors including parallelism, memory capacity, job flow trigger point, and data compression.

The parallelism is some items controlling parallelism of a job, e.g., the number of the map tasks and the reduce tasks that will be run simultaneously. It is involved with cluster resource capacity, like the number of CPU cores per host computer.

The memory capacity is some items specifying the memory capacity for an operation, such as the memory size for sorting key-value pairs and metadata, or buffering the input data of a reduce task.

The job flow trigger point is some items setting the time point to an operation, such as a threshold of the memory capacity to buffer the output from map. Whenever the threshold is exceeded, the system starts to sort and then spill those sorted key-value pairs from the memory to the disk.

The data compression is some items determining to compress the map tasks and the reduce task.

Moreover, the system information SI1 may include a system hardware specification and/or a system software specification.

In step S120, the processing unit 120 determines whether a performance model M1 which, for example, includes a relationship of a performance, the application information AI1, the framework information FI1, and the system information SI1 is stored in the storage unit 130. If the performance model M1 is stored in the storage unit 130, then the process proceeds to step S130; if the performance model M1 is not stored in the storage unit 130, then the process proceeds to step S150.

In one embodiment, the performance model M1 is a multivariable regression model, an ensemble regression model, or a hybrid regression model. For example, the performance model M1 may be presented as an equation (1).

$$P=M(A,F,S) \quad (1)$$

"P" is the performance, "A" is the application information, "F" is the framework information, and "S" is the system information. For example, the performance may be a performing time.

In step S130, the processing unit 120 obtains the application parameter setting APS1 and the system specification setting SSS1 according to the performance model M1. For example, the processing unit 120 obtains the application parameter setting APS1 and the system specification setting SSS1 according to an equation (2). For a performance model, Y is the value that maximizes the performance value of the performance model. For an application execution time model, Y is the value that minimizes the time value of the application execution time model.

$$Y=\arg\max M_{performance\_index}(A,F,S) \text{ or } Y=\arg\min M_{application\_execution\_time}(A,F,S) \text{ subject to } h_j(A|F|S) \geq b_j \text{ for } j=1 \text{ to } n \text{ where } n \text{ is the number of constraints} \quad (2)$$

Y is a set of "A", "F", and "S." In this step, the application parameter setting APS1 and the system specification setting SSS1 are calculated under a predetermined limited condition "$h_j(A|F|S) \geq b_j$ for j=1 to n". Each constraint can be a single limitation or a combination of several limitations. For example, $h_1 \leq 32$ is a single limitation. $h_2 \geq 2$ is a single limitation. $h_3 \geq 2$, $h_3 = h_{31} + h_{32}$ is a combination of two limitations. $h_5 \leq h_4$ is a dependent limitation.

In step S140, the processing unit 120 outputs the application parameter setting APS1 and the system specification setting SSS1, and the communication unit 110 transmits the application parameter setting APS1 and the system specification setting SSS1 to the cluster 200, for example, via the network 900. Then, the cluster 200 can be adjusted according to the application parameter setting APS1 and the system specification setting SSS1.

Figure 3:
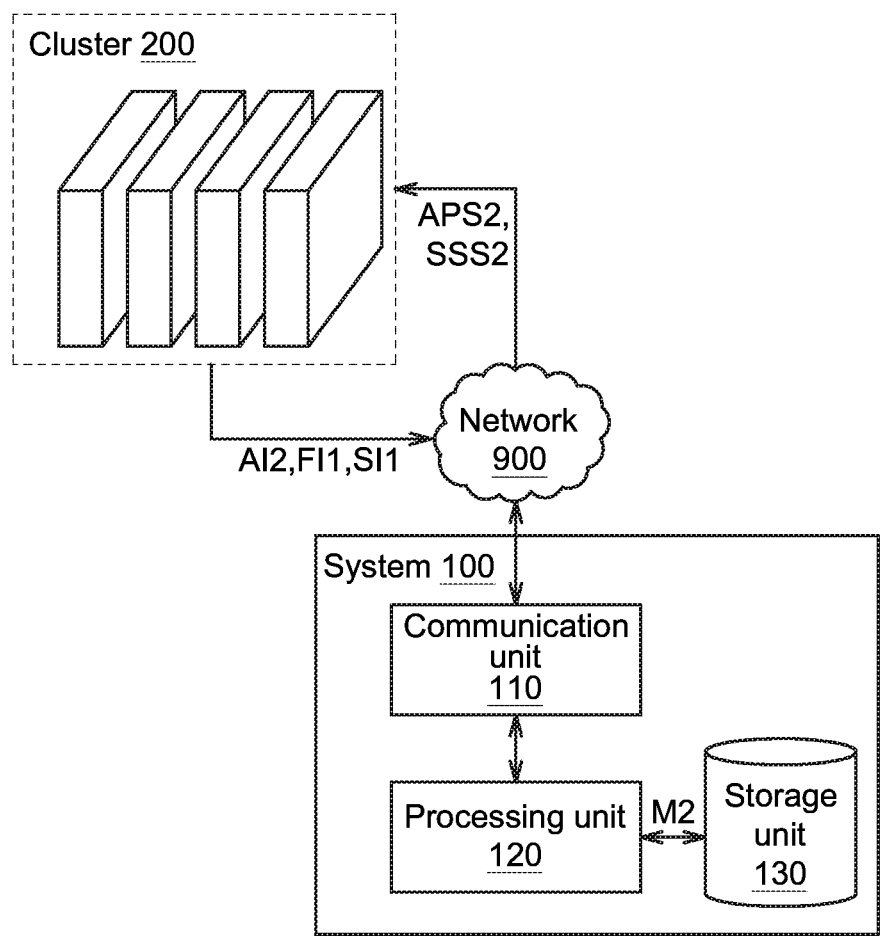
FIG. 3 shows the system for recommending the application parameter setting and the system specification setting in the distributed computation according to another embodiment.

Please referring to FIG. 2 and FIG. 3, FIG. 3 shows the system 100 for recommending the application parameter setting and the system specification setting in the distributed computation according to another embodiment. In this embodiment, the communication unit 110 receives an application information AI2, the framework information FI1 and the system information SI1. A performance model M2 which, for example, includes a relationship of the performance, the application information AI2, the framework information FI1, and the system information SI1 is not stored in the storage unit 130. Therefore, after performing the step S120, the process will proceed to step S150.

In step S150, the processing unit 120 determines whether a log file corresponding to the application information AI2 is already recorded in the storage unit 130. If the log file is already recorded in the storage unit 130, then the process proceeds to step S160; if the log file is not recorded in the storage unit 130, then the process proceeds to step S170. In this embodiment, the log file corresponding to the application information AI2 is already recorded in the storage unit 130. Therefore, the process proceeds to step S160.

In step S160, the processing unit 120 generates the performance model M2 according to the log file. The log file records a performing history including the execution time in each phase, and the amount of processed data. Then, the process proceeds to step S130 to obtain the application parameter setting APS2 and the system specification setting SSS2 according to the performance model M2.

In another embodiment, the log file is not recorded in the storage unit 130, then the process proceeds to step S170. In step S170, the processing unit 120 obtains the application parameter setting APS2 and the system specification setting SSS2 according to a predetermined rule. The predetermined rule is set according a computational parallelism relative parameter (CPRP), a memory utilization relative parameter (MURP), a disk utilization relative parameter (DURP), and a strategically, policy and miscellaneous parameter (SPMC).

Therefore, the cluster 200 can be adjusted according to the application parameter setting APS2 and the system specification setting SSS2.

Figure 4:
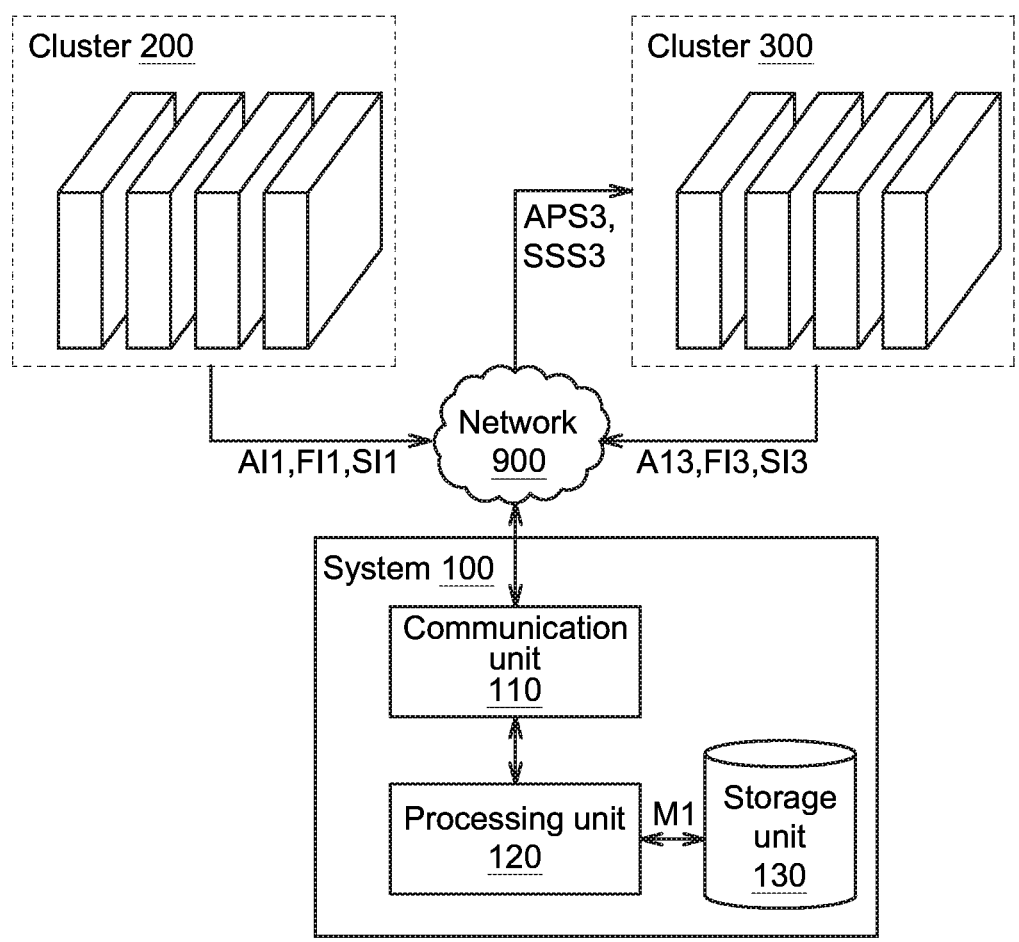
FIG. 4 shows the system for recommending the application parameter setting and the system specification setting in the distributed computation according to another embodiment.

Please referring to FIG. 4, FIG. 4 shows the system 100 for recommending the application parameter setting and the system specification setting in the distributed computation according to another embodiment. In this embodiment, another cluster 300 is newly established. Therefore, the user needs to know a system specification setting SSS3 of the cluster 300.

By performing the method of FIG. 2, the communication unit 110 can receive the application information AI1, the framework information FI1 and the system information SI1 from the cluster 200 to generate the performance model M1. And, the communication unit 110 can receive an application information AI3, a framework information FI3 and a system information SI3 from the cluster 300. Whether the application information AI3 is identical to the application information AI1 may be determined according to some data, such as hash code and checksum, stored in the storage unit 130, and the framework information FI3. Then, the processing unit 120 can obtain an application parameter setting APS3 and the system specification setting SSS3 according to the performance model M1. That is to say, the performance model M1 is generated according to the cluster 200 and the performance model M1 generated according to the cluster 200 is used to obtain the application parameter setting APS3 and the system specification setting SSS3 of the newly established cluster 300.

Figure 5:
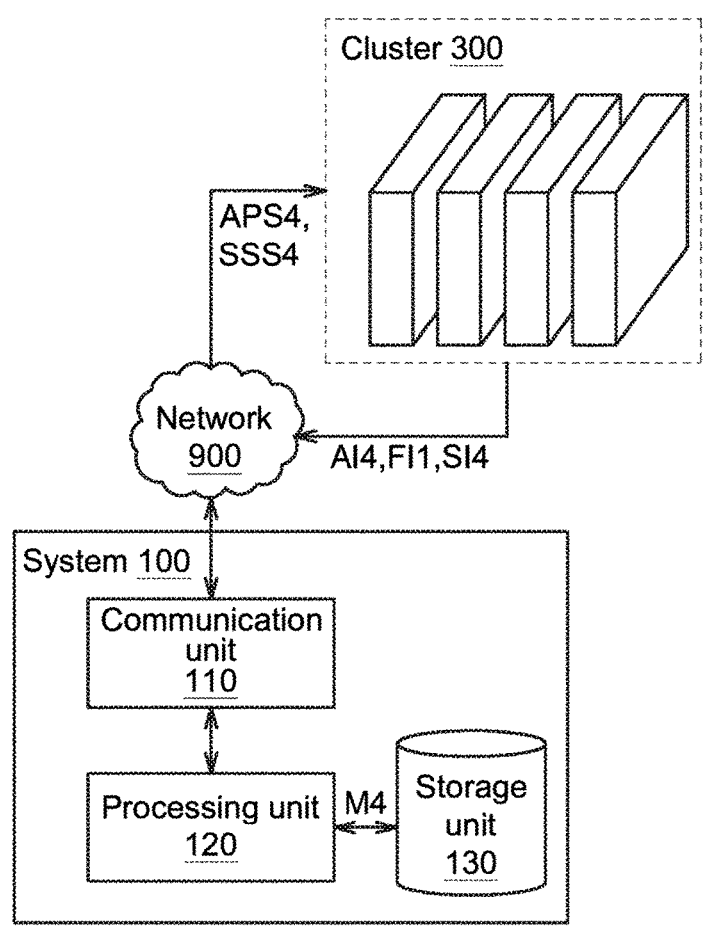
FIG. 5 shows the system for recommending the application parameter setting and the system specification setting in the distributed computation according to another embodiment.

Please referring to FIG. 5, FIG. 5 shows the system 100 for recommending the application parameter setting and the system specification setting in the distributed computation according to another embodiment. In this embodiment, a performance model M4 which includes the relationship of the performance, the application information AI4, the framework information FI1 and the system information SI1 is already stored in the storage unit 130. In this embodiment, the cluster 300 is already established, but an application corresponding an application information AI4 was not be performed in the cluster 300 before. The user needs to know an application parameter setting APS4 for the cluster 300.

By performing the method of FIG. 2, the communication unit 110 can receive the application information AI4, the framework information FI1 and a system information SI4 from the cluster 300. Then, the processing unit 120 can obtain the application parameter setting APS4 and a system specification setting SSS4 according to the performance model M4. That is to say, the performance model M4 is stored in the storage unit 130 and the performance model M4 is used to obtain the application parameter setting APS4 and the system specification setting SSS4 of the cluster 300.

In this disclosure, the application parameter setting and the system specification setting can be obtained according to the application information, the framework information and the system information. The application parameter setting and the system specification setting of a newly established cluster can be obtained according to a performance model of an existed cluster. Further, when a cluster needs to perform an application which is not performed before, the application parameter setting and the system specification setting of this cluster can be obtained according to a performance model generated according to another cluster which performed this application before.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for recommending an application parameter setting and a system specification setting in a distributed computation, comprising:
   receiving application information, framework information and system information;
   determining whether a performance model which includes a relationship among a performance, the application information, the framework information and the system information is stored in a storage device, wherein
   the performance is an output of the performance model, the performance being a performing time, and
   the application information, the framework information and the system information are inputs of the performance model; and
   obtaining the application parameter setting and the system specification setting according to the performance model, the application information, the framework information and the system information, if the performance model is stored in the storage device;
   wherein in the step of obtaining the application parameter setting and the system specification setting according to the performance model, the application parameter setting and the system specification setting are calculated under a predetermined limited condition; and
   the performance model is generated according to a first cluster and the performance model generated according to the first cluster is used to obtain the application parameter setting and the system specification setting of a second cluster.

2. The method according to claim 1, further comprising:
   determining whether a log file is already recorded, if the performance model is not stored in the storage device; and
   generating the performance model according to the log file, if the log file is already recorded.

3. The method according to claim 2, further comprising:
   obtaining the application parameter setting and the system specification setting according to a predetermined rule, if the log file is not recorded.

4. The method according to claim 1, wherein the performance model is a multivariable regression model, an ensemble regression model, or a hybrid regression model.

5. The method according to claim 1, wherein the application information includes an application name, a hash code, a checksum, a profile, application metadata, a program identification and a resource performance.

6. The method according to claim 1, wherein the framework information includes a parallelism, a resource configuration, a resource management strategy, a data management strategy, a computation model tunable parameter, and a supported environment control parameter.

7. The method according to claim 1, wherein the system information includes a system hardware specification and a system software specification.

8. A system for recommending an application parameter setting and a system specification setting in a distributed computation, comprising:
   a communication unit receiving application information, framework information and system information;
   a storage device; and
   a processor
   determining whether a performance model which includes a relationship among a performance, the application information, the framework information and the system information is stored in the storage device, and
   obtaining the application parameter setting and the system specification setting according to the performance model, the application information, the framework information and the system information, if the performance model is stored in the storage device, wherein
   the performance is an output of the performance model, the performance being a performing time, and
   the application information, the framework information and the system information are inputs of the performance model;
   wherein the processor calculates the application parameter setting and the system specification setting under a predetermined limited condition; and
   the processor generates the performance model according to a first cluster and obtains the application parameter setting and the system specification setting of a second cluster according to the performance model generated according to the first cluster.

9. The system according to claim 8, wherein
   the processor further determines whether a log file is recorded in the storage device, if the performance model is not stored in the storage device; and
   the processor generates the performance model according to the log file, if the log file is recorded.

10. The system according to claim 9, wherein the processor further obtains the application parameter setting and the system specification setting according to a predetermined rule, if the log file is not recorded.

11. The system according to claim 8, wherein the performance model is a multivariable regression model, an ensemble regression model or a hybrid regression model.

12. The system according to claim 8, wherein the application information includes an application name, a hash code, a checksum, a profile, application metadata, a program identification and a resource performance.

13. The system according to claim 8, wherein the framework information includes a parallelism, a resource configuration, a resource management strategy, a data management strategy, a computation model tunable parameter, and a supported environment control parameter.

14. The system according to claim 8, wherein the system information includes a system hardware specification, and a system software specification.

\* \* \* \* \*